United States Patent [19]
Conner, Jr. et al.

[11] Patent Number: 4,992,675
[45] Date of Patent: Feb. 12, 1991

[54] ADAPTIVE THRESHOLD CONTROL CIRCUIT

[75] Inventors: Leo B. Conner, Jr., Phoenix; Robert J. Burdge, Mesa, both of Ariz.

[73] Assignee: Motorola, Inc., Schaumburg, Ill.

[21] Appl. No.: 330,569

[22] Filed: Mar. 30, 1989

[51] Int. Cl.$^5$ .................. H03K 5/08; H03K 5/153
[52] U.S. Cl. ............................. 307/358; 307/359; 307/547; 307/549
[58] Field of Search ........... 307/358, 359, 540, 542, 307/543, 547, 549, 553, 555

[56] References Cited

U.S. PATENT DOCUMENTS

| | | | |
|---|---|---|---|
| 3,348,065 | 10/1967 | Schmidt | 307/358 |
| 3,387,222 | 6/1968 | Hellwarth et al. | 307/358 |
| 3,737,790 | 6/1973 | Brown | 307/358 |
| 3,999,083 | 12/1976 | Bumgardner | 307/358 |
| 4,367,441 | 1/1983 | Niyada et al. | 307/359 |
| 4,426,591 | 1/1984 | Cargille | 307/358 |
| 4,786,903 | 11/1988 | Grindahl et al. | 340/825.540 |

*Primary Examiner*—John Zazworsky
*Attorney, Agent, or Firm*—Frank J. Bogacz

[57] ABSTRACT

This circuit provides output detection pulses in response to interrogation signals for transponder systems which require a high degree of sensitivity and a low degree of false alarms. This circuit includes a tracking arrangement which monitors the level of noise and adjusts a control signal to exclude noise below a certain threshold. A comparator generates detection pulses in response to the input interrogation signals and the control signal. As a result, detection pulses are produced only for interrogation signals on a one-for-one basis. At the same time, the circuit adjusts its sensitivity so that low power interrogation signals (sufficiently above the noise level) may be accurately detected without responding excessively to noise. In addition, an active clamp circuit increases the gain and sensitivity of the circuit by clamping the noise level to approximately a ground state. The circuit is totally insensitive to the interrogation pulse amplitude and relatively insensitive to the interrogation pulse rate.

13 Claims, 1 Drawing Sheet

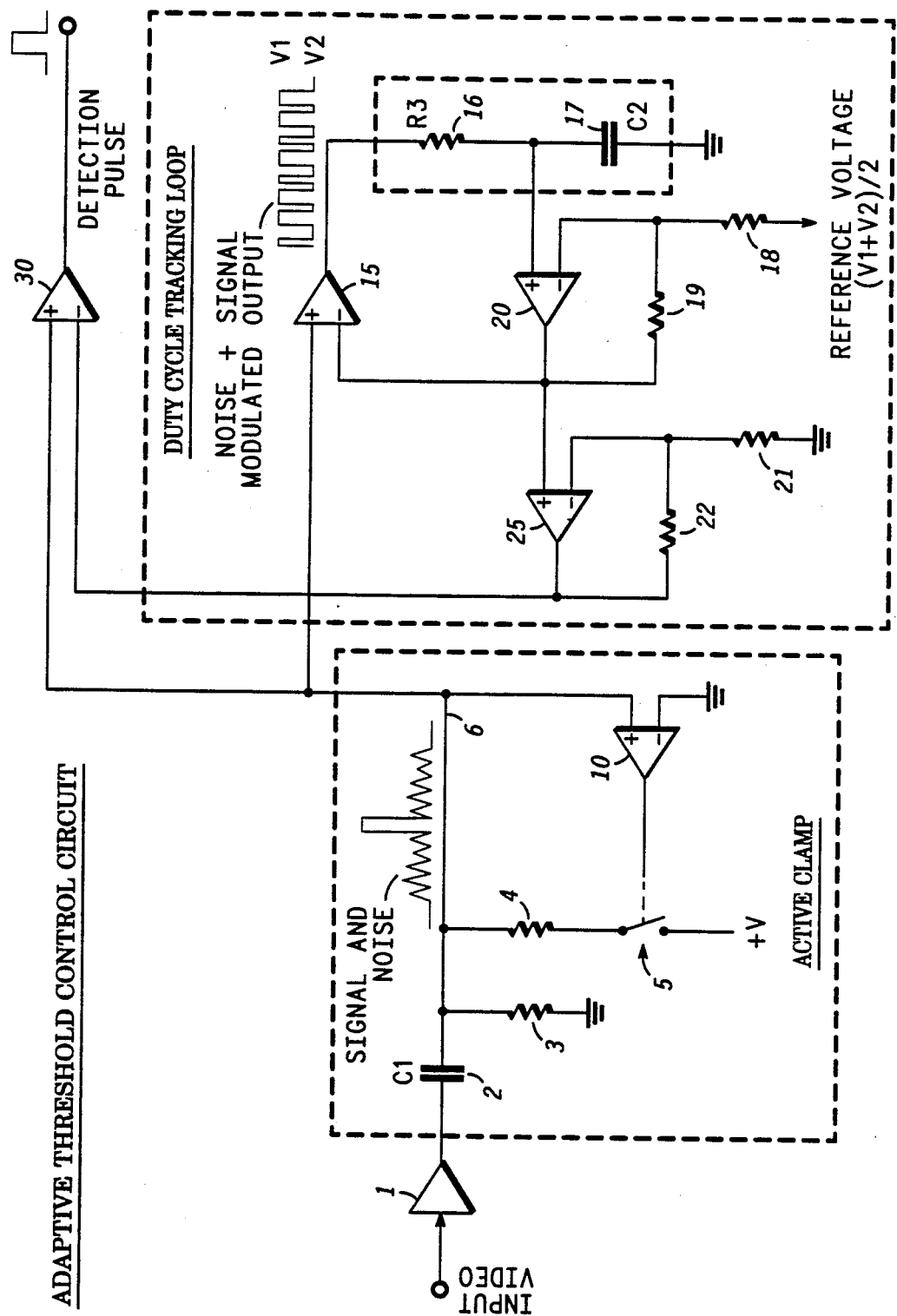

ADAPTIVE THRESHOLD CONTROL CIRCUIT

BACKGROUND OF THE INVENTION

The present invention generally pertains to transponders and more particularly to circuitry for dynamically adjusting the threshold level of a transponder to detect low power interrogation signals while not responding excessively to noise as a result of temperature variation, aging of components or other environmental conditions.

Transponders must be designed to respond to a wide range of input interrogation levels. At low interrogation power levels, the transponder's threshold must be adjusted to detect interrogation signals while rejecting noise. If a transponder responds to noise instead of interrogation signals, errors are generated in the transponder system. As the error rate increases, transponder performance decreases.

As mentioned above, modern transponders require response to low power interrogation signals. If transponder thresholds are set sufficiently high to insure that they will not respond to noise, these low power interrogation signals may be ignored as well. A high threshold setting will have the affect of reducing the false alarm rate, that is responding to noise instead of interrogation signals, but will decrease the sensitivity of the transponder. Thereby, low threshold settings may substantially raise the false alarm rate for modern transponders since these transponders must respond to low power level interrogation signals. These high threshold settings also reduce the sensitivity of the transponder.

To maintain transponder sensitivity at low threshold settings, the transponder circuitry must be very stable. This invention will minimize variations in the transponder's performance. This stability requirement considerably increases the cost of a transponder.

Accordingly, it is an object of the present invention to provide an adaptive threshold control circuit which reduces the cost and increases the reliability of a transponder while maintaining high sensitivity to low power interrogation signals and disregarding noise.

SUMMARY OF THE INVENTION

In accomplishing the object of the present invention, a novel adaptive threshold control circuit is shown.

A transponder system receives low power interrogation signals including noise. The system produces a detection pulse for each interrogation signal received. The adaptive threshold control circuit provides for producing detection pulses from interrogation signals while eliminating erroneous responses to noise.

The adaptive threshold control circuit includes a clamp circuit, which passes the high frequency interrogation signals while maintaining the noise level at approximately a ground state. A threshold generator is connected to the clamp circuit and provides a modulated output proportional to the detected noise level. A pulse detection circuit is connected to the clamp circuit and to the threshold generator. The pulse detection circuit operates in response to the passed interrogation signals and to the control signal of the threshold generator to produce detection pulses output for each interrogation signal received while providing sensitivity of the adaptive threshold control circuit to low power level interrogation signals which may be close to the level of noise.

BRIEF DESCRIPTION OF THE DRAWING

The single sheet of drawings included herewith is a schematic diagram of an adaptive threshold control circuit embodying the principles of operation of the present invention.

DESCRIPTION OF THE PREFERRED EMBODIMENT

Referring to the single sheet of drawings included herewith, an adaptive threshold control circuit is shown. The input video is transmitted to video amplifier 1. The active clamp circuit includes capacitor 2, resistors 3 and 4, switch 5 and comparator 10. Capacitor 2 is serially connected to the output of video amplifier 1. Resistor 3 is connected between capacitor 2 and ground. Resistor 4 is connected to the common connection of resistor 3 and capacitor 2 and to switch 5. The common connection of resistor R4, resistor R3 and capacitor 2 (lead 6) is connected to the positive input of comparator 10. The negative input to comparator 10 is connected to ground. The output of comparator 10 is connected to and operates switch 5. Logic 0 output of comparator 10 closes switch 5.

The common connection of resistors 3 and 4, capacitor 2 and the positive input to comparator 10 is connected to the positive input of comparators 15 and 30. The output of comparator 15 is connected to resistor 16. Resistor 16 is connected serially between the output of comparator 15 and capacitor 17. Capacitor 17 is connected serially between resistor 16 and ground.

The common connection of resistor 16 and capacitor 17 is connected to the positive input of comparator 20. Resistor 18 is connected between the negative input of comparator 20 and a reference voltage source (equal to V1 plus V2) divided by 2. Resistor 19 is connected between the negative input of comparator 20 and the output of comparator 20. The output of comparator 20 is connected to the negative input of comparator 15. In addition, the output of comparator 20 is connected to the positive input of threshold amplifier 25. Resistor 21 is connected between the negative input the amplifier 25 and ground. Resistor 22 is connected between the negative input to amplifier 25 and the output of amplifier 25. In addition, the output of amplifier 25 is connected to the negative input of comparator 30. Comparators 15 and 20, amplifier 25, resistors 16, 18, 19, 21 and 22; and capacitor 17 comprise a duty cycle tracking loop.

The output of comparator 30 is the detection pulse signal. This signal may be used to trigger other logic of the transponder.

The transponder receives interrogation signals via its antenna (not shown). Interrogation signals which include a noise component are filtered, amplified and converted to input video. This signal is then amplified by amplifier 1 as shown in the figure. The output of video amplifier 1, which includes the interrogation signal and noise, is clamped approximately to ground by the active clamp circuitry. The signal and noise is shown above lead 6 in the figure.

Capacitor C1 removes any DC voltage which exists on the input video signal. Whenever the noise voltage on lead 6 drops below ground, the output of comparator 10 goes to the logic 0 state. As a result, switch 5 is closed. A positive voltage (logic 1) is then applied to resistor 4. The voltage on lead 6 will then be driven in a positive direction. Thereby the voltage on lead 6 will offset the negative component of the noise.

When the voltage on lead 6 exceeds the zero voltage level, comparator 10 will go to the logic 1 state. This will cause switch 5 to open. Thereby the positive voltage source is removed from lead 6.

To summarize, whenever the voltage on lead 6 goes negative, it is offset by the positive current that flows through closed switch 5 and resistor 4. When the voltage on lead 6 goes positive, switch 5 is opened by comparator 10. The resulting action will effectively clamp the noise voltage to a 0 voltage level. This clamping action operates at noise voltage levels in the low millivolt range.

When no noise is present on lead 6, the bias current from comparators 10, 15 and 30 will drive the voltage on lead 6 below the 0 voltage level. Comparator 10 outputs logic 0 which closes switch 5. Again, positive voltage is applied to resistor 4 and a current flows through resistor 4. When the voltage on lead 6 exceeds 0 volts, comparator 10 outputs a logic 1 and switch 5 is open. Thereby the voltage is removed from resistor 4 and current flow is inhibited. Comparator 10 will continuously oscillate to clamp lead 6 to ground.

The output of comparator 15 is a function of the threshold voltage set on the negative or inverting input terminal. The voltage at the negative terminal of comparator 15 is dependent upon the voltage across capacitor 17, which is connected to the positive input terminal of error amplifier 20. Initially, the voltage across capacitor 17 is 0 volts. A reference voltage of (V1 plus V2) divided by 2 is applied to the resistor network including resistors 18 and 19. The resistor network is connected to the negative input to error amplifier 20. V1 is approximately equal to the logic 1 level (+5 volts) and V2 is equal to the logic 0 level (0 volts). Thus, the reference voltage will be nominally 2.5 volts. Other voltages between 0 and 5 volts may be used, but the duty cycle of comparator 15 will change from 50% accordingly. This results in the output voltage of error amplifier 20 being negative. As a result, the reference voltage for comparator 15 will also be negative.

The input voltage on lead 6, which is input to comparator 15, will be approximately 0 volts or slightly positive. Therefore, comparator 15 will output a logic 1. Capacitor 17 will begin to charge toward the logic 1 voltage level. As the voltage across capacitor 17 increases, the output of error amplifier 20 becomes more positive. Since this output is fed back to comparator 15, the input threshold to comparator 15 via the negative input rises. Eventually the threshold voltage input to comparator 15 via the negative input will be more positive than the input voltage on lead 6. This will result in the output of comparator 15 going to the logic 0 (approximately zero voltage) state. Capacitor 17 will begin to discharge. This will lower the threshold voltage applied via the negative input to comparator 15. As a result, the output of comparator 15 will again go to the logic 1 (approximately +5 volt) state. Capacitor 17 will be charged as a result. The comparator threshold under control of this tracking loop will continue to charge to maintain an approximate 50% duty cycle for the output of comparator 15.

As the noise voltage level on lead 6 increases, the average DC voltage on lead 6 will increase proportionately. This DC voltage increase is directly related to the RMS (root mean square) value of the noise. The increase in the average DC level due to the noise, causes the duty cycle of comparator 15 in the logic 1 state to increase. This results in an increase in the voltage across capacitor 17. This increased voltage is amplified by error amplifier 20. The result is to increase the threshold voltage applied to comparator 15 via the negative input. The threshold voltage to comparator 15 continues to increase by this feedback mechanism until the duty cycle has been restored to approximately 50%. The stability of this feedback loop is controlled by the RC low pass filter formed by resistor 16 and capacitor 17.

The proper threshold level for comparator 30 is provided by the output of error amplifier 20, which also provides for additional gain. Further gain is provided by threshold amplifier 25. The gain of threshold amplifier 25 can be set to control the detection pulse output of comparator 30. Resistors 21 and 22 provide the proper biasing for the operation of threshold amplifier 25. The output of detection pulse lead of comparator 30 represents detection of an interrogation signal by the adaptive threshold control circuit. False alarms are defined as signals on the detection pulse lead which are due to noise and not actual interrogation signals received by the circuit. The probability of false alarm signals occurring may be predicted as a function of the RMS noise level and the threshold level. The gain of threshold amplifier is set so that the proper threshold is provided to comparator 30 to achieve the desired false alarm rate.

The input video signals will contain both interrogation signal pulses and noise. The interrogation pulses will cause comparator 15 to output a logic 1. The pulse rate of interrogation pulses is relatively low with respect to positive noise peaks. Therefore, the number of noise peaks and interrogation pulses which exceed the threshold of comparator 15 will have a negligible affect on the average duty cycle of comparator 15. This is true even though interrogation pulses may cause a significant increase in the RMS voltage on lead 6 from the active clamp circuit. Although the amplitude of the interrogation pulses is relatively great, the duty cycle of comparator 15 will not change significantly. In addition, the threshold applied to the negative input of comparator 30 will not change sufficiently so as to degrade system sensitivity.

This adaptive threshold control circuit may be implemented without the active clamp portion of the circuit. In this configuration, both the dynamic range and loop gain of the circuit will be 6 db less.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. An adaptive threshold control circuit for distinguishing low power transponder interrogation signals from a noise component, said adaptive threshold circuit comprising:

clamp circuit means for maintaining said noise component at approximately a first voltage level, said clamp circuit means operating in response to said transponder interrogation signal and said noise component to produce a clamped signal;

threshold means connected to said clamp circuit means, said threshold means operating in response to said clamped signal to produce an output signal controlled by the voltage of said noise component, said output signal having an approximately 50% duty cycle;

said threshold means including:

tracking means operating in response to said clamped signal to produce second output signals which correspond to variations in said noise component;

filter means connected between said tracking means and a source of a first voltage level, said filter means operating in response to said second output signals to pass low frequencies of said second output signals; and error detecting means connected to said filter means, to said tracking means, to said source of said first voltage level and to a reference voltage source, said error detecting means operating in response to said passed second output signals to provide said output signal proportional to the voltage of said noise component; and means for generating transponder detection pulses, said means for generating connected to said clamp circuit means and to said threshold means, said means for generating operating in response to said clamped signal and in response to said output signal to provide detection pulses in response to said lower power transponder interrogation signals.

2. An adaptive threshold control circuit as claimed in claim 1, said clamp circuit means including:

input video means for receiving said transponder interrogation signal and said noise component;

means for removing DC voltage being connected to said video input means and to said tracking means; and means for selectively applying a voltage, said means for selectively applying a voltage including a first and second inputs and an output, said first input being connected to said means for removing DC, said second input being connected to said source of said first voltage level and said output being selectively connected to said means for removing DC.

3. An adaptive threshold control circuit as claimed in claim 2, said means for selectively applying including:

switching means connected to a source of a second voltage level; and first resistive means connected between said switching means and said means for removing DC; and said switching means operated in response to said means for said selectively applying to couple said source of said second voltage level to said means for removing DC via said first resistive means.

4. An adaptive threshold control circuit as claimed in claim 3, said clamp circuit means further including second resistive means connected between said means for removing DC and said source of said first voltage level.

5. An adaptive threshold control circuit as claimed in claim 4, said means for selectively applying including voltage comparator means.

6. An adaptive threshold control circuit as claimed in claim 5, said error detecting means including:

error amplifier means connected to said filter means and to said tracking means, said error amplifier means operating to produce a threshold signal; and third resistive means connected to said error amplifier means and to said reference voltage source, said third resistive means operating in response to said reference voltage source to provide a voltage to said error amplifier means proportional to the combination of a first logic level and a second logic level.

7. An adaptive threshold control circuit as claimed in claim 6, said error detecting means further including:

threshold amplifier means connected to said error amplifier means, said threshold amplifier means operating to increase the voltage of said threshold signal of said error amplifier means to produce said output signal; and fourth resistive means connected between said threshold amplifier means and to said source of said first logic level.

8. An adaptive threshold control circuit as claimed in claim 7, said tracking means including a first voltage comparator means having a positive input, a negative input, and an output, said positive input being connected to said means for removing DC, said negative input being connected to said error amplifier means and to said threshold amplifier means, and said output being connected to said filter means.

9. An adaptive threshold control circuit as claimed in claim 8, said filter means including:

fifth resistive means connected to said output of said first voltage comparator means; and first energy storage means connected serially between said fifth resistive means and said source of said first logic level.

10. An adaptive threshold control circuit as claimed in claim 9, said error amplifier means including second voltage comparator means having a positive input, a negative input and an output, said positive input being connected to said serial connection of said fifth resistive means and said first energy storage means, said negative input being connected to said third resistive means, and said output being connected to said first voltage comparator means and to said third resistive means.

11. An adaptive threshold control circuit as claimed in claim 10, said threshold amplifier means including third voltage comparator means having a positive input, a negative input and an output, said positive input being connected to said output of said second voltage comparator means, said negative input being connected to said fourth resistive means.

12. An adaptive threshold control circuit as claimed in claim 11, said means for generating including fourth voltage comparator means having a positive input, a negative input and an output, said negative input being connected to said output of said third voltage comparator means, said positive input being connected to said positive input of said first voltage comparator means and to said means for removing DC voltage, said output providing said detection pulses responsive to said low power transponder interrogation signals.

13. An adaptive threshold control circuit as claimed in claim 12, said means for removing DC including second energy storage means connected between said input video means and said means for selectively applying.

* * * * *